United States Patent [19]
Lu

[11] Patent Number: 6,143,366
[45] Date of Patent: Nov. 7, 2000

[54] HIGH-PRESSURE PROCESS FOR CRYSTALLIZATION OF CERAMIC FILMS AT LOW TEMPERATURES

[76] Inventor: Chung Hsin Lu, Wen-Lin Rd., No. 25 7F, Taipei, Taiwan

[21] Appl. No.: 09/220,824

[22] Filed: Dec. 24, 1998

[51] Int. Cl.[7] .................................. B05D 3/02; C25C 5/50
[52] U.S. Cl. .................................... 427/376.3; 427/376.1; 427/376.2; 427/377; 427/529; 427/596; 427/248.1; 117/6; 117/7; 117/8; 204/192.15; 204/192.2; 205/224
[58] Field of Search ................................ 427/377, 376.2, 427/376.3, 376.1, 249.1, 523, 527, 529, 530, 562, 563, 564, 566, 567, 569, 576, 575, 578, 579, 585, 586, 596, 597, 248.1, 255.23, 255.29, 255.31, 255.32, 255.36, 255.395; 204/192.15, 192.16, 192.2, 192.22; 117/6, 7, 8, 9, 10

[56] References Cited

U.S. PATENT DOCUMENTS

| | | | |
|---|---|---|---|
| 4,584,053 | 4/1986 | Namba et al. | 117/6 |
| 5,096,882 | 3/1992 | Kato et al. | 427/596 |
| 5,290,761 | 3/1994 | Keating et al. | 427/596 |
| 5,330,966 | 7/1994 | Hayashi et al. | 427/596 |
| 5,398,639 | 3/1995 | Doll et al. | 117/10 |
| 5,443,030 | 8/1995 | Ishihara et al. | 117/10 |
| 5,468,687 | 11/1995 | Carl et al. | |
| 5,626,670 | 5/1997 | Varshney et al. | |
| 5,882,400 | 3/1999 | Bauer et al. | 117/10 |
| 5,914,068 | 6/1999 | Hiratani et al. | 117/6 |

FOREIGN PATENT DOCUMENTS

| | | | |
|---|---|---|---|
| 000241179A3 | 12/1986 | Germany | 117/6 |
| 359018188 | 1/1984 | Japan | 117/6 |
| 360033285 | 2/1985 | Japan | 117/6 |

OTHER PUBLICATIONS

Lu, et al., "Laser–induced phase transformation from amorphous to perovskite in $PbZr_{0.44}Ti_{0.56}O_3$ films with the substrate at room temperature," *Appl. Phys. Lett.*, vol. 65, No. 17, Oct. 1994.

Yoshimura, et al., "In situ fabrication of morphology–controlled advanced ceramic materials by Soft Solution Processing," *Solid State Ionics*, vol. 98, No month 1997, pp. 197–208.

Yu, et al., "Electron irradiation induced crystallization of amorphous $MgAl_2O_4$," *Materials Chemistry and Physics*, vol. 46, (No month) 1996, pp. 161–165.

Yu, et al., "High–quality epitaxial growth of γ–alumina films on α–alumina sapphire induced by ion–beam bombardment," *Physical Review B*, vol. 52, No. 24, Dec. 1995, pp. 17518–17522.

*Primary Examiner*—Marianne Padgett
*Attorney, Agent, or Firm*—Ladas & Parry

[57] ABSTRACT

A process is disclosed for reducing the crystallization temperature of amorphous or partially crystallized ceramic films by providing a higher pressure under which the crystallization of the amorphous or partially crystallized ceramic films can be significantly enhanced. The present invention not only improves quality, performance and reliability of the ceramic films, but also reduces the cost for production. By lowering the crystallization temperature, the cost for thermal energy consumed during the crystallization process is greatly reduced. In addition, the interaction or interdiffusion occurring between films and substrates is significantly suppressed or essentially prevented, avoiding the off-stoichiometry and malfunction of thin films, which usually occur in the conventional high-temperature crystallization processes. The process of present invention also decreases the grain size of formed films, thus reducing the roughness of films and producing relatively smooth, good quality films. This process made possible the fabrication of ceramic films with larger area at substantially lower temperatures without using other excitation energy such as laser, ion beam or electron beam, and is applicable to very large scale integrated circuit technologies. The present invention finds broad applications including manufacturing electronic and optical devices such as ferroelectric memories, capacitors, actuators, piezoelectric transducers, pyroelectric sensors, gas-sensors, electro-optic displays, electro-optic switching, non-liner optical devices, and reflective/antireflective coating, etc.

19 Claims, 5 Drawing Sheets

HIGH-PRESSURE PROCESS FOR CRYSTALLIZATION OF CERAMIC FILMS AT LOW TEMPERATURES

FIELD OF THE INVENTION

The present invention relates to an improvement in a process for the fabrication of crystallized ceramic films. More specifically, this invention relates to a process for crystallizing ceramic films at relatively low temperatures by using high-pressure environment.

BACKGROUND OF THE INVENTION

The wide range of interesting and useful properties exhibited by ceramic films makes them technically important. The ceramic films can be deposited or coated on objects to prevent the coated objects from corrosion or attrition. On the other hand, the ceramic films exhibiting specific electric properties constitute key components in a wide range of electronic and optical devices. The electronic devices using ceramic films include ferroelectric memories, piezoelectric transducers, capacitors, dielectric resonators, gas-sensors, pyroelectric sensors, actuators, and transducers. Particularly, the ferroelectric ceramic thin films have increasingly attracted great interest for the use in nonvolatile random access memories (NVRAM) due to their large reversible spontaneous polarization, and for the use in dynamic access memories (DRAM) owing to their high dielectric constant. As for the optical devices, ceramic films have been applied in non-liner optical devices, electro-optic switching, electro-optic displays, and reflective/antireflective coating.

To prepare ceramic films for different applications, various types of processing methods have been developed. These methods can be classified into two categories: namely, chemical and physical processes. For chemical processes, chemical vapor deposition, spin coating, dipping, and sol-gel processing have been developed. As for the physical processes, evaporation, ion-beam deposition, molecular beam epitaxy, radio-frequency and DC sputtering, and laser ablation have been widely investigated. In general, the as-grown ceramic films deposited on substrates at low temperatures are amorphous or partially crystallized. In order to completely crystallize the as-prepared films, either the high temperatures on substrates during the deposition processes or the post-annealing process at high temperatures for deposited films is required. Usually, the crystallization process of ceramic films demands fairly high temperatures. For example, the crystallization temperature for $Pb(Zr, Ti)O_3$ and $SrTiO_3$ is 600° C. at least, and that for $SrBi_2Ta_2O_9$ is above 650° C. The high-temperature heating often results in interference in the film-substrate interface, and causes difficulties in integrating the films with substrates. The most common substrates for ferroelectric ceramic films are silicon substrates owing to their wide applications in ULSI technology. During the high-temperature annealing processes, the silicon will be oxidized to form silicon dioxide layers, bringing difficulties in integrating the ceramic films with silicon monolithic circuits. The high-temperature annealing also significantly enhances the diffusion of the species into ceramic films as well as substrates, thereby rendering the interdiffusion and interaction between films and substrates. The undesirable reactions occurring in the film-substrate interface result in the deviation of the composition in ceramic films and doping of foreign atoms in silicon circuits which cause serious problems in varying the electrical properties of ceramic films as well as silicon circuits. The high-temperature annealing also enhances the grain growth rate on films and results in coarsening of grains and increases the roughness of films. The rough morphology of films increases the difficulties in the subsequent processes of etching and patterning. As a result, the high temperature processing for preparing ceramic films is not suitable to be integrated into the silicon processing technologies, due to the temperature limitations as to the stability of the underlying silicon wafers and structures and properties of ceramic films.

In order to overcome the drawbacks of high-temperature processing for crystallizing as-deposited ceramic films, new crystallization processes such as hydrothermal processing, hydrothermal electrochemical processing, laser annealing, ion-beam bombardment, electron-irradiation, and plasma processing have been developed recently. In hydrothermal processing and hydrothermal electrochemical processing, substrates are immersed into aqueous solutions containing constituent species and are reacted with solutions to form the desired compounds on the substrate surface (see, for example, Yoshimura et al., Solid State Ionics, Vol. 98 (3/4), p. 197 (1997)). The hydrothermal processes prepare various ceramic films at relatively low temperatures ranging from 100° C. to 300° C. However, in these processes, the substrates are immersed in reactive solutions and directly contact with reactive solutions. Since the reactive solutions usually contain high concentration of acid or alkaline reactants, undesirable corrosion will easily occur on the substrates. As for USLI technology, the silicon substrates usually have different patterns or metal lines deposited on the surface of substrates. Due to the corrosion problems, the hydrothermal processing is not suitable for ULSI technology.

Laser-induced crystallization processes have been investigated recently. Lu et al., Appl. Phys. Lett. Vol. 65 (16), p. 2015 (1994), used rf-magnetron sputtering to prepare $PbZr_{0.44}Ti_{0.56}O_3$ (PZT) amorphous ceramic films on glass substrates, then laser scanned the resultant films. The output power of the laser-scan was 2.5 W, beam spot diameter was 90 $\mu$m, and the scanning rate was 4.5 cm/s. Under these conditions, the amorphous PZT films can be transformed into crystallized state at room temperature. Varshney, U.S. Pat. No. 5,626,670, also used similar laser techniques to enhance the crystallization of PZT films prepared by the spin-on sol-gel process.

On the other hand, Yu et. al., Phys. Rev. Vol. 52 (24), p. 17518 (1995), investigated the crystallization of alumina films induced by ion-beam bombardment. Amorphous alumina films were coated on single crystal alumina, and then bombarded with argon or oxygen ions at temperatures ranging from 400° C. to 600° C. This study indicates that the ion-beam bombardment effectively induces the amorphous-to-$\gamma$ phase transformation of alumina. Yu et. al., Mater. Chem. and Phys. Vol. 46 (2/3), p.161 (1996), also employed electron irradiation to facilitate the crystallization of amorphous $MgAl_2O_4$ films. Single crystal $MgAl_2O_4$ substrates were coated with amorphous $MgAl_2O_4$ films by Xe ion irradiation. After the coated films were subjected to electron irradiation at 300 keV at room temperature, the crystallized $MgAl_2O_4$ films were obtained. Carl et al, U.S. Pat. No. 5,468,687, utilized the ozone enhanced plasma to enhance the crystallization of $Ta_2O_5$ films prepared by chemical vapor deposition, and reduced the annealing temperature to as low as 400° C.

Although the laser annealing, ion-beam bombardment, and electron-irradiation techniques can successfully induce the crystallization of amorphous ceramic films at relatively low temperatures, the small beams of laser, ion, and electron beams pose significant concerns when the above technologies are applied to mass produce crystallized ceramic films having large surface areas. Using the scanning technique during the irradiation processes can enlarge the area of crystallized ceramic films; however, the low scanning rate limits the throughput of ceramic films, and the possibility of mass production. On the other hand, the high excitation energy sources including laser, ion, electron beams, and plasma will damage ceramic films and create defects in films, thereby deteriorating the electrical properties of prepared films. Thus, in order to overcome the disadvantages encountered in the prior methods, a process that can crystallize as-deposited or as-coated ceramic films at relatively low temperatures and is practicable for mass production, would be highly desirable.

SUMMARY OF THE INVENTION

As a result of numerous experiments, the inventor of the present invention unexpectedly found that using high-pressure treatment in a closed chamber can significantly enhance the low-temperature crystallization of as-deposited or as-coated ceramic films prepared by chemical or physical methods. Crystallized ceramic films can be obtained at temperature as low as 200° C.–400° C. by employing the high-pressure treatment in the present invention. The crystallization temperature in the present invention is several hundred degrees centigrade lower than that in conventional annealing processes.

According to one aspect of the subject invention, a method is provided for producing the crystallized ceramic film by forming an amorphous or partially crystallized ceramic film on a substrate and then heat-treating the amorphous ceramic or partially crystallized film at an elevated temperature and under a pressure higher than 5 atm.

According to another aspect of the subject invention, ceramic films produced by the above method are also provided.

The pressure of the process may be realized by, for example, but not limited to, undergoing the process in a closed chamber, within which volatile species are present to provide the desired vapor pressure under the elevated temperature. By varying volatile materials and hence changing the vapor pressure, the heating temperature of coated ceramic films can be adjusted.

Due to the advantage of lowered crystallization temperatures, the thermal budget during the processing of ceramic films is significantly reduced, so is the energy cost. Furthermore, the interaction or interdiffusion between ceramic films and substrates that commonly happens in conventional high-temperature processes is also effectively suppressed, which prevents the off-stoichiometry and malfunction of thin films. Since the crystallization process occurs at low temperatures, the coarsening of grains (grain growth) is also suppressed. Therefore smooth films having fine grains can be obtained, and the roughness of films can be minimized. The present invention does not require complicated and expensive excitation energy such as laser, ion beam, electron beam, or plasma. According to the present invention, only high-pressure media are required for the crystallization of ceramic films at low temperatures. This process is suitable for fabricating ceramic films with large area, and is highly compatible with very large-scale integrated circuit (VLSI) technologies. This invention can be applied in fabricating electronic and optical devices such as ferroelectric memories, capacitors, pyroelectric sensors, gas-sensors, actuators, piezoelectric transducers, electro-optic displays, electro-optic switching, non-liner optical devices, and reflective/antireflective coating, etc.

DETAILED DESCRIPTION OF THE INVENTION

This invention is based on the inventor's unanticipated experimental results. The inventor surprisingly found that using high pressure remarkably induces the as-deposited or as-coated ceramic film with amorphous or partially crystallized structure to be well crystallized at substantially lower temperatures. Thus, this invention is directed to a method for producing crystallized ceramic film by forming an amorphous or partially crystallized ceramic film on a substrate and then heat-treating the amorphous ceramic or partially crystallized film at an elevated temperature under a pressure higher than 5 atm.

The amorphous or partially crystallized ceramic film, or equivalently called the as-deposited or as-coated ceramic film, is prepared by chemical or physical methods, and then heated in a closed chamber with high vapor pressure for inducing the crystallization of the film. To the inventor's knowledge, this kind of high-pressure treatment has never been reported in the past for crystallizing as-deposited or as-prepared ceramic film.

Ceramics are inorganic nonmetallic materials which consist of metallic and nonmetallic elements bonded together primarily by ionic and/or covalent bonds. The chemical compositions of ceramics vary considerably from simple compounds to mixtures of many complex phases bonded together (see Smith, "Principles of Materials Science and Engineering," second edition, p.559, McGraw-Hill Publishing Company, New York, 1990). The types of ceramics include oxides, nitrides, borides, carbides, halides, hydrides, or oxtnitrides. The structures of ceramics include rock salt, zinc blende, perovskite, complex perovskite, layered perovskite, pyrochlore, wurtzite, corudum, illmenite, rutile, spinel, anti-spinel, olivine, fluorite, antiflourite, cesium chloride type, gibbsite, tungsten bronze, and silicate type. Some ceramics contain the mixtures of the above structures. See Kingery et al, "Introduction to Ceramics," John Wiely & Sons, New York, 1991, and Galasso, "Structure and Properties of Inorganic Solids," Pergamon, New York, pp. 39–251, 1970.

The ceramic films of the present invention are not limited to any specific composition or crystal structure. It was found as evidenced by the examples that the high-pressure process of the present invention can enhance the crystallization of the amorphous or partially crystallized ceramic films at relatively lower temperatures, regardless of the composition or crystal structure of the ceramic films.

The most common crystal structures for the ceramic films contemplated in the present invention include simple cubic, face-centered cubic, rock salt, zinc blende, perovskite, complex perovskite, layered perovskite, pyrochlore, wurtzite, corudum, illmenite, rutile, spinel, anti-spinel, olivine, fluorite, antiflourite, cesium chloride type, gibbsite, tungsten bronze, silicate type, and any mixture thereof. Ceramic materials with a perovskite structure preferably has a composition of $A(B', B'')O_3$, which are composed of the site A comprising at least one element from lead, barium, strontium, calcium, and lanthanum, bismuth, potassium and sodium, the sites B' and B" comprising at least one element from magnesium, chromium, nickel, manganese, iron, cobalt, copper, titanium, tin, zirconium, cerium, niobium, molybdenum and tungsten.

As for the composition of the ceramic films, the present invention is not limited to ceramic films of any specific composition. Typical compositions of the ceramic films which are suitable for the present invention are, but not limited to, $SrBi_2Ta_2O_9$, $BaBi_2Ta_2O_9$, and $(Sr, Ba)Bi_2Ta_2O_9$ of layered perovskite structure, $Pb(Zr, Ti)O_3$ and $PbTiO_3$ of perovskite structure, and $Sr_2Ta_2O_7$ and $Pb_3Nb_4O_{13}$ of pyrochlore structure. The synthesized films of $SrBi_2Ta_2O_9$, $BaBi_2Ta_2O_9$, $(Sr, Ba)Bi_2Ta_2O_9$, $Pb(Zr, Ti)O_3$, and $PbTiO_3$ are all important ferroelectric materials.

As evidenced by the examples in the specification, the applicability of the present invention is not to be limited by the structure and composition of ceramic films. The ceramic films produced according to the present invention can be used in fabricating DRAM, NVRAM, superconductor devices, conductive electrodes, capacitors, flat displays, sensors, solar cells, lithium batteries, and catalysis, and non-liner optical devices, etc.

Compared with other prior processes in which the amorphous or partially crystallized ceramic films are heated under ambient pressure, the present invention undergoes the crystallization step under elevated pressures. It is believed that any pressure higher than atmospheric pressure can facilitate the crystallization and the pressure is preferably higher than 5 atm, more preferably between 10 atm and 250 atm.

By elevating the pressure in the heat-treatment step, the crystallization can be enhanced and thus the temperature in heat-treatment can be reduced, avoiding the problems as described in the Background of the Invention section of the present specification.

According to the present invention, the crystallization temperature can be reduced to below 600° C., preferably 550° C., more preferably below 500° C., most preferably between 100° C. and 400° C.

The amorphous or partially crystallized ceramic films may be formed by any conventional chemical or physical processes which include chemical vapor deposition, spin coating, dipping, sol-gel processing, evaporation, electroplating, electrophoretic deposition, ion-beam deposition, sputtering, sputtering, and laser ablation.

The crystallization step of the present invention does not require expensive and complicated equipments such as laser, ion/electron irradiation, or plasma processes, and can be applied to fabricate crystallized ceramic films with large areas. Therefore, the present invention is advantageous for mass production. In one example as described below, with a pressure of 56.5 atm, the crystallization temperature of $SrBi_2Ta_2O_9$ is as low as 280° C. which is the lowest temperature in the present art. As for $Pb(Zr, Ti)O_3$, the crystallization temperature can be lowered to 300° C. under a pressure of 77.6 atm. The low-temperature process can reduce the consumed heating energy, and also makes the ceramic films to be compatible with present ULSI technologies for fabricating DRAM and NVRAM. Owing to the low-temperature heating, the oxidation of silicon or metal can be reduced. According to the analysis of secondary ion mass spectroscopy (SIMS), the interaction and interdiffusion usually occurring at high temperatures in the interface between films and substrates are significantly minimized. Based on the analysis of scanning electron microscopy (SEM), the grain size of formed films in the present invention is relatively smaller than that prepared in high-temperature processing. Atomic force microscopy (AFM) also confirms that the rather smooth films are obtained in this invention. Consequently, the high-pressure-enhanced crystallization process not only results in suppression of interaction or interdiffusion between films and substrates, but also improves the morphology of crystallized films to have fine grains and smooth surface.

As for the substrates of ceramic films, any material that has been known in the present art for forming ceramic films can be used. Especially, it is possible to use materials having low melting points, such as glass or polymers, since the heat treatment of as-prepared ceramic films can be performed at relatively low temperature.

The substrates contemplated by the present invention are not limited to those having a flat surface. The substrates having curved surfaces are also applicable in the present invention.

As for the volatile species for providing elevated vapor pressure, all species which can be vaporized at the desired crystallization temperatures and generate sufficiently high vapor pressure can be used. In the cases of nitride or carbide ceramic films, the inert gas such as nitrogen or argon is preferred for avoiding the oxidation of prepared films. For using solution as the pressure sources in the chamber, volatile species, for example, organic or inorganic solvents such as benzene, ethyl alcohol, and acetone, organic or inorganic alkali such as ammonium hydroxide, tetraethylammonium hydroxide, and monoethanolamine, organic or inorganic acids such as acetic acid, nitric acid, and formic acid, can be added in the solution. Once the temperature is raised, the added species vaporize to increase the vapor pressure. In case of using solution as pressure sources at high temperature, the amount of solution used should be sufficient to generate the required pressure.

DESCRIPTION OF THE PREFERRED EMBODIMENTS

The present invention will be illustrated in greater detail by way of the following examples. The examples are given for illustration of the invention, and are not intended to be limited thereof.

EXAMPLE 1

This example shows the effects of high-pressure treatment on the crystallization of layered perovskite-$SrBi_2Ta_2O_9$ films.

Figure 1:
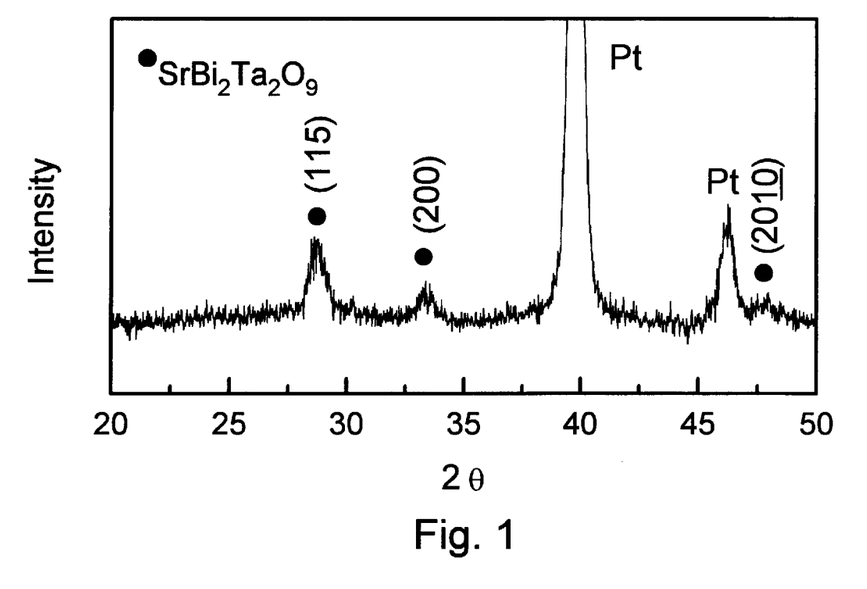
FIG. 1 illustrates the x-ray diffraction of crystallized $SrBi_2Ta_2O_9$ films prepared by a high-pressure treatment of 78.9 atm at 300° C. for 2 hours according to the invention.

The precursors of $SrBi_2Ta_2O_9$ films were prepared by mixing strontium 2-ethylhexanoate, bismuth 2-ethylhexanoate, and tantalum ethoxide in stoichiometric proportion. The prepared precursors were deposited onto a $Pt/Ti/SiO_2/Si$ substrates by spin-coating. The Ti layer was used to improve adhesion between Pt and $SiO_2$ layers. The coated films were dried at 150° C., and subsequently pyrolyzed at 350° C. for around 10 min. No diffraction peaks except for the peaks belonging to platinum from the substrates were found in the pyrolyzed films by x-ray diffraction (XRD) analysis. Thus, the pyrolyzed films were identified to be amorphous. Then, these as-pyrolyzed films were placed and heated in a closed bomb where water was filled in the bottom of the bomb and used as the vapor source. The amount of water was kept from direct contact with the films at the beginning of the experiment. The heating temperatures were 260° C. and 300° C., and the duration time was 2 hours. The generated pressures at the above two temperatures were 700 psi (47.6 atm) and 1160 psi (78.9 atm), respectively. After the high-pressure process at 260° C., the amorphous ceramic films became slightly crystallized. Upon heating at 300° C., well-developed crystallized $SrBi_2Ta_2O_9$ films were obtained as shown in FIG. 1. In this figure, the diffraction peaks with (115), (200), and (2010) indexes belonging to $SrBi_2Ta_2O_9$ are clearly identified. Therefore, the effect of high-pressure treatment on the crystallization of $SrBi_2Ta_2O_9$ films was confirmed. The platinum diffraction peaks in FIG. 1 were produced from the underlying substrates. The top platinum electrodes were sputtered on the surface of prepared films, and a standard ferroelectricity analyzer (RT66A) was employed to analyze the ferroelectric characteristics. It was found that the $SrBi_2Ta_2O_9$ films had a typical ferroelectric hysteresis polarization-electric field (P-E) loop. In addition, in the fatigue endurance test, no degradation in polarization occurred after $10^9$ switching cycles. The grain size of $SrBi_2Ta_2O_9$ films was about 0.04 μm as observed by scanning electron microscopy (SEM). Accordingly, the prepared $SrBi_2Ta_2O_9$ films exhibited excellent ferroelectric properties, and can be applied in nonvolatile random access memories (NVRAM).

COMPARATIVE EXAMPLE 1

Figure 2:
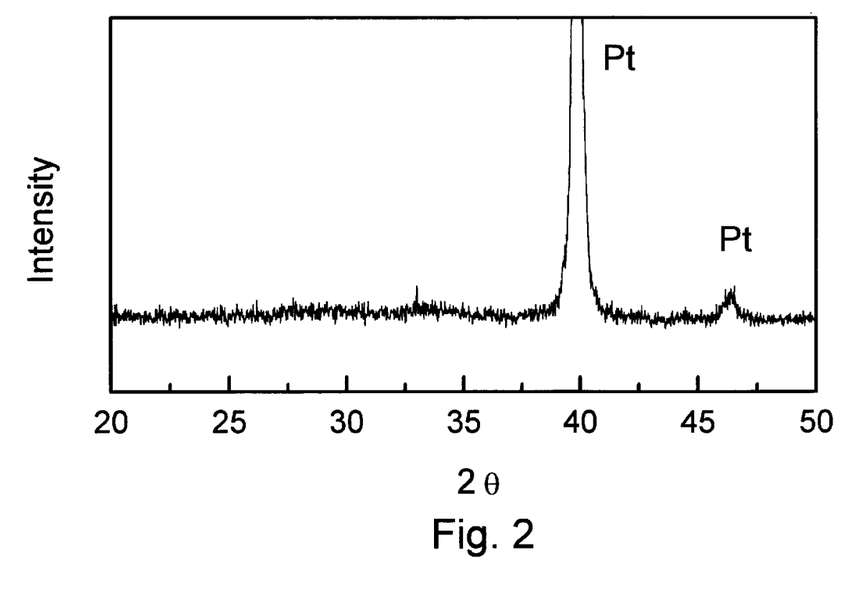
FIG. 2 illustrates the x-ray diffraction of amorphous $SrBi_2Ta_2O_9$ films heated at 300° C. for 2 hours in a conventional heating process.

The same procedure as in Example 1 was repeated except that the pyrolyzed films were heated in a conventional electric furnace, instead of a closed chamber, at 300° C. and 700° C. for 2 hours. It was found that no crystallization of $SrBi_2Ta_2O_9$ films occurred after heating at 300° C. as shown in FIG. 2. On the other hand, increasing the heating temperature to be as high as 700° C. in the conventional process resulted in the similar degree of crystallization in $SrBi_2Ta_2O_9$ films as that prepared in Example 1. Therefore, the crystallization temperature of $SrBi_2Ta_2O_9$ films in the high-pressure process is 400° C. lower than that in the conventional heating process. It definitely reveals that the high-pressure process remarkably reduces the crystallization temperature of $SrBi_2Ta_2O_9$ films. The grain size as observed by scanning electron microscopy (SEM) was about 0.06 μm, which is greater than the grain sizes of $SrBi_2Ta_2O_9$ films in Example 1. In addition, atomic force microscopy (AFM) also confirmed that rougher surface was obtained when compared with that of $SrBi_2Ta_2O_9$ films in Example 1 because of its large grain size. According to the analysis of secondary ion mass spectroscopy (SIMS), the high temperature heating (700° C.) in the COMPARATIVE EXAMPLE 1 resulted in the diffusion of bismuth species into the substrate region. On the other hand, as shown in the results of the low-temperature heating (300° C.) process in Example 1, the diffusion of bismuth species into substrates was suppressed. Conclusively, the low crystallization temperature in the high-pressure process significantly reduced the thermal budget in processing as well as energy consumption. Furthermore, the interaction or interdiffusion between films and substrates was also greatly suppressed or prevented, avoiding the off-stoichiometry of thin films and malfunction of substrates or wafers. Therefore, it is significantly advantageous to integrate $SrBi_2Ta_2O_9$ films with the present processes for the production of silicon-based semiconductors. In addition, the high-pressure process decreases the grain size of formed $SrBi_2Ta_2O_9$ films, thereby reducing the roughness of films. The production of relatively smooth $SrBi_2Ta_2O_9$ films is beneficial for the etching and patterning processes in ULSI technologies.

EXAMPLE 2

Figure 3:
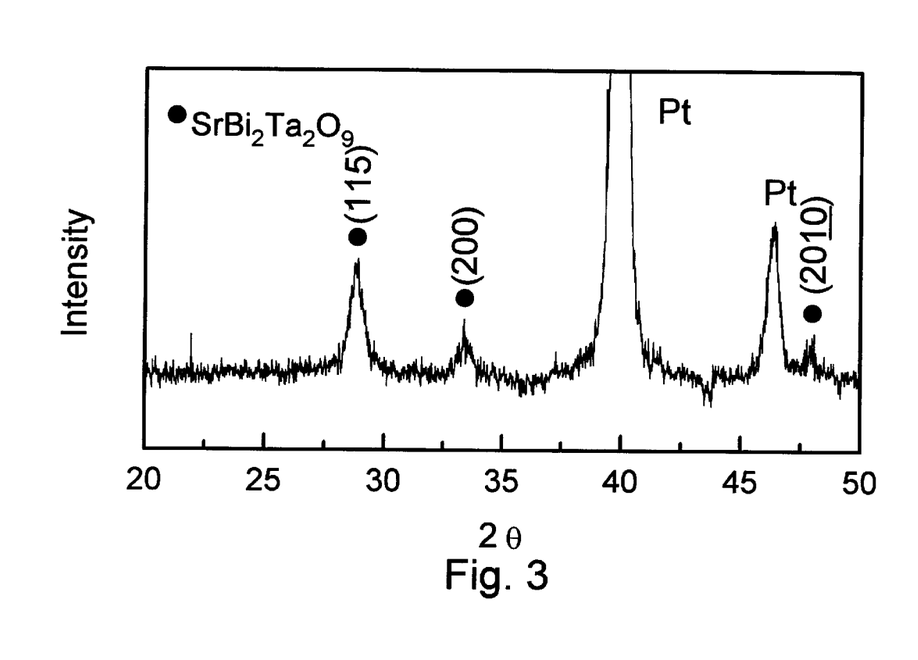
FIG. 3 illustrates the x-ray diffraction of crystallized $SrBi_2Ta_2O_9$ films prepared by a high-pressure treatment of 89.4 atm using ammonia solution as a pressure source at 300° C. for 2 hours according to the invention.

This example shows the effects of vapor media on the crystallization of $SrBi_2Ta_2O_9$ films. For increasing the applied pressure on prepared films, ammonia solution with pH=12 was used in the high-pressure process to produce the vapor species. Since at elevated temperatures ammonia will be vaporized from the solution, the pressure in the closed chamber will be increased. The same procedure as in Example 1 was repeated except that the pyrolyzed films were heated in the chamber where ammonia solution was used as the vapor source. Under heating at 300° C., the pressure in the chamber was increased to be 1315 psi (89.4 atm) which was higher than that in Example 1. The heating time was held for 2 hours. At the end of heating process, it was found that the crystallized $SrBi_2Ta_2O_9$ films were also formed (as shown in FIG. 3). The formed films exhibited higher diffraction intensity than those prepared in Example 1. This result reveals that better crystallinity of $SrBi_2Ta_2O_9$ films was achieved in Example 2. Therefore, the high pressure produced by the vapor media was confirmed to enhance the crystallization process of $SrBi_2Ta_2O_9$ films. The enhanced crystallization of $SrBi_2Ta_2O_9$ films in this example is attributed to the increased vapor pressure by ammonia.

EXAMPLE 3

This example shows the effects of high-pressure treatment on the crystallization of $SrBi_2Ta_2O_9$ films prepared by radio-frequency (rf) sputtering.

Figure 4:
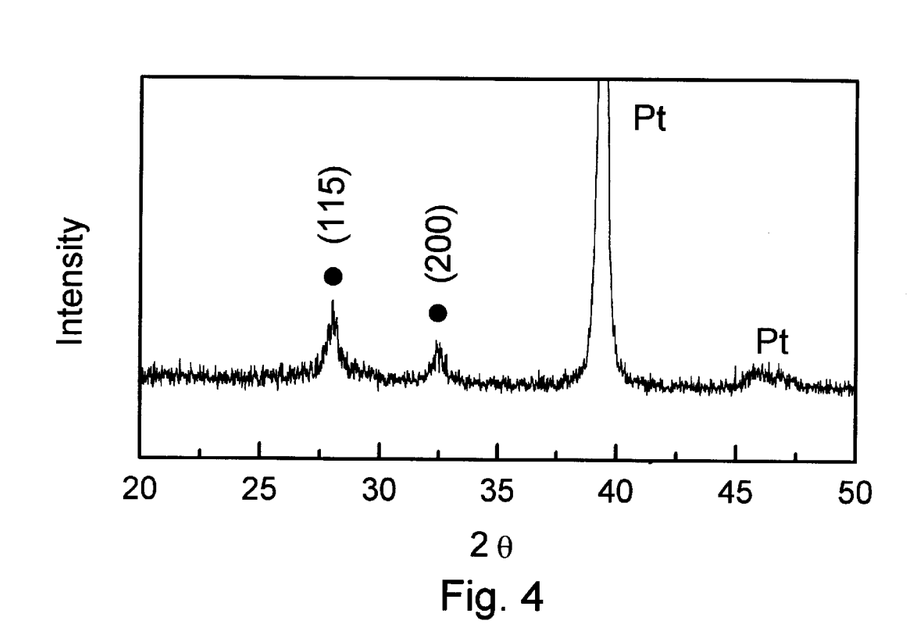
FIG. 4 illustrates the x-ray diffraction of crystallized $SrBi_2Ta_2O_9$ films prepared by radio-frequency magnetron sputtering and a subsequent high pressure treatment of 56.5 atm at 280° C. for 2 hours.

The $SrBi_2Ta_2O_9$ films were deposited onto $Pt/Ti/SiO_2/Si$ substrates using a radio-frequency magnetron sputtering system. The composition of the targets was Sr:Bi:Ta=2:4:2 with excess strontium and bismuth in order to compensate for the loss of Sr and Bi during the deposition process. The distance between the substrates and targets was 3 cm, and the sputtering time was 30 min. The as-deposited films were then subjected to a high-pressure treatment of 830 psi (56.5 atm) at 280° C. for 2 hours. The pressure was the same as that in Example 1. After the high-pressure treatment, well crystallized $SrBi_2Ta_2O_9$ films were obtained. As shown in FIG. 4, this example confirmed that the high-pressure treatment successfully induced the crystallization of rf-sputtered $SrBi_2Ta_2O_9$ films. This example reveals that the high-pressure treatment can enhance the crystallization of $SrBi_2Ta_2O_9$ films no matter they are prepared by chemical processing (such as Example 1) or physical processing (such as Example 3).

EXAMPLE 4

This example shows the effects of high pressure treatment on the crystallization of ferroelectric layer perovskite- $(Sr_{0.5}Ba_{0.5})Bi_2Ta_2O_9$ films.

The precursors of $(Sr_{0.5}Ba_{0.5})Bi_2Ta_2O_9$ films were prepared by mixing barium 2-ethylhexanoate, strontium 2-ethylhexanoate, bismuth 2-ethylhexanoate, and tantalum ethoxide according to the stoichiometric proportion. The prepared precursor was deposited onto $Pt/Ti/SiO_2/Si$ substrates using spin-coating method. The coated films were dried at 150° C., and subsequently pyrolyzed at 350° C. for around 10 min. No diffraction peaks except for the peaks belonging to platinum from the substrates were found in the pyrolyzed films by x-ray diffraction (XRD) analysis. Thus, the pyrolyzed films were identified to be amorphous. Then, these as-pyrolyzed films were placed and heated in a closed bomb in the similar conditions as described in Example 1. The heating temperature was 280° C., and the duration time was 2 hours. The generated pressures were 830 psi. After heating at 280° C., well-developed crystallized $(Sr_{0.5}Ba_{0.5})Bi_2Ta_2O_9$ films were obtained. In addition, the XRD pattern is similar to that of $SrBi_2Ta_2O_9$, indicating that the $SrBi_2Ta_2O_9$-based solid solution was formed. Therefore, the high-pressure treatment is confirmed to be highly effective for crystallizing the films of the solid solutions of $SrBi_2Ta_2O_9$.

EXAMPLE 5

This example shows the effects of high pressure treatment on the crystallization of ferroelectric $Pb(Zr_{0.52}Ti_{0.48})O_3$ films with a perovskite structure.

Figure 5:
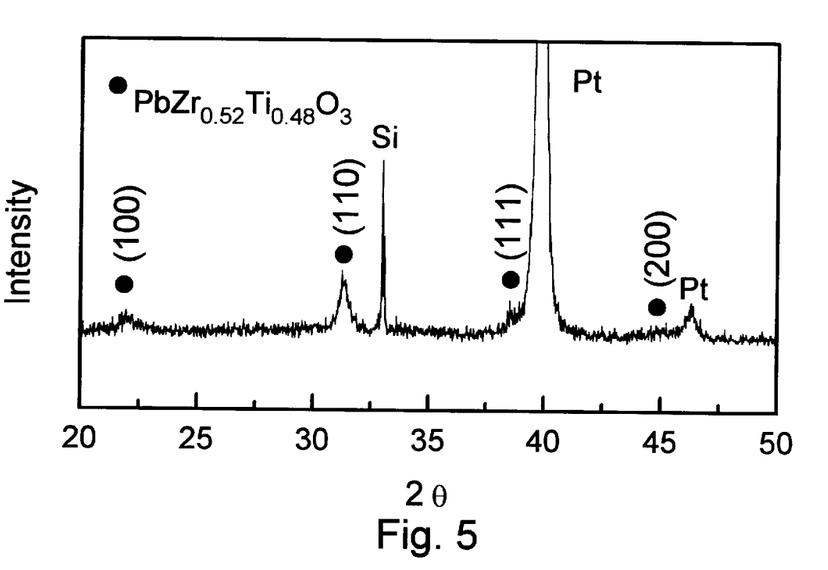
FIG. 5 illustrates the x-ray diffraction of $Pb(Zr_{0.52}Ti_{0.48})O_3$ films prepared by a high-pressure treatment of 77.6 atm at 300° C. for 4 hours according to the invention.

The precursors of $Pb(Zr_{0.52}Ti_{0.48})O_3$ films were prepared by mixing lead 2-ethyhexanoate, zirconium n-propoxide, and tetraisopropyl orthotitanate according to the stoichiometric proportion. The prepared precursors were deposited onto $Pt/Ti/SiO_2/Si$ substrates using spin-coating method. The coating and pyrolyzing processes were the same as described above. The pyrolyzed amorphous ceramic films were subjected to a high-pressure treatment. The heating condition was 300° C. under 1140 psi (77.6 atm), and the heating time was 4 hours. After the above treatment, well crystallized $Pb(Zr_{0.52}Ti_{0.48})O_3$ films were obtained, as shown in FIG. 5. In this figure, the diffraction peaks with (100), (110), (111), and (200) indexes belonging to $Pb(Zr_{0.52}Ti_{0.48})O_3$ are clearly identified. This example confirms the availability of applying the high pressure process to induce the crystallization of $Pb(Zr_{0.52}Ti_{0.48})O_3$ films at low temperatures.

COMPARATIVE EXAMPLE 5

Figure 6:
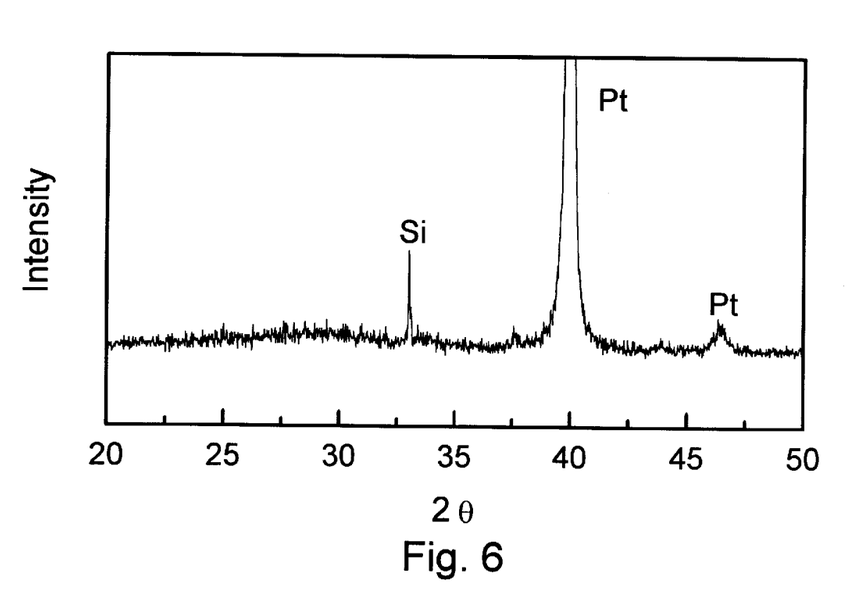
FIG. 6 illustrates the x-ray diffraction of amorphous $Pb(Zr_{0.52}Ti_{0.48})O_3$ films heated at 300° C. for 4 hours in a conventional heating process.

The same procedure as in Example 5 was repeated except that the pyrolyzed films were heated in a conventional electric furnace instead of a high-pressure chamber, at 300° C. for 4 hours. It was found that no crystallization of $Pb(Zr_{0.52}Ti_{0.48})O_3$ films occurred after 300° C.-heating. The XRD pattern for the 300° C.-annnealed films is illustrated in FIG. 6. This figure shows that the annealed films remain amorphous. In comparison with Example 5, the results definitely reveal that the high-pressure process remarkably reduces the crystallization temperature of $Pb(Zr_{0.52}Ti_{0.48})O_3$ films.

EXAMPLE 6

This example shows the effects of high-pressure treatment on the crystallization of $PbTiO_3$ films with a perovskite structure.

Figure 7:
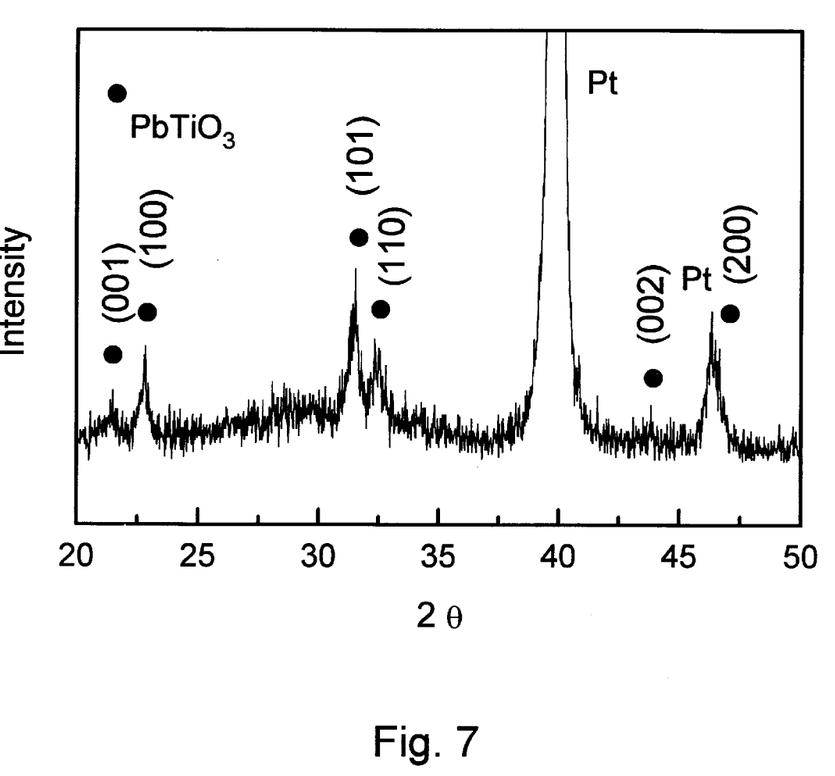
FIG. 7 illustrates the x-ray diffraction of crystallized $PbTiO_3$ films prepared by a high-pressure treatment of 77.6 atm at 300° C. for 2 hours according to the invention.

The precursors of $PbTiO_3$ films were prepared by mixing lead 2-ethyhexanoate and tetraisopropyl orthotitanate in stoichiometric proportion. The prepared precursor was deposited onto $Pt/Ti/SiO_2/Si$ substrates by spin-coating. The coated films were dried at 150° C., and subsequently pyrolyzed at 350° C. for 10 min. The pyrolyzed amorphous ceramic films were subjected to a high-pressure treatment. The heating condition was 300° C. under 1140 psi (77.6 atm), and the heating time was 2 hours. As confirmed by the x-ray diffraction pattern of $PbTiO_3$ films, at the end of the above treatment, the well crystallized $PbTiO_3$ films having a perovskite structure were obtained as shown in FIG. 7. In this figure, the diffraction peaks with (001), (100), (101), (110), (002), and (200) indexes belonging to $PbTiO_3$ are clearly identified. This example confirmed that the high-pressure treatment enhanced the crystallization of perovskite $PbTiO_3$ films at low temperatures. The fabricated films are useful for the applications of ferroelectric memories, piezoelectric devices and actuators.

EXAMPLE 7

This example shows the effects of high-pressure treatment on the crystallization of paraelectric $Pb_3Nb_4O_{13}$ films with a pyrochlore structure.

Figure 8:
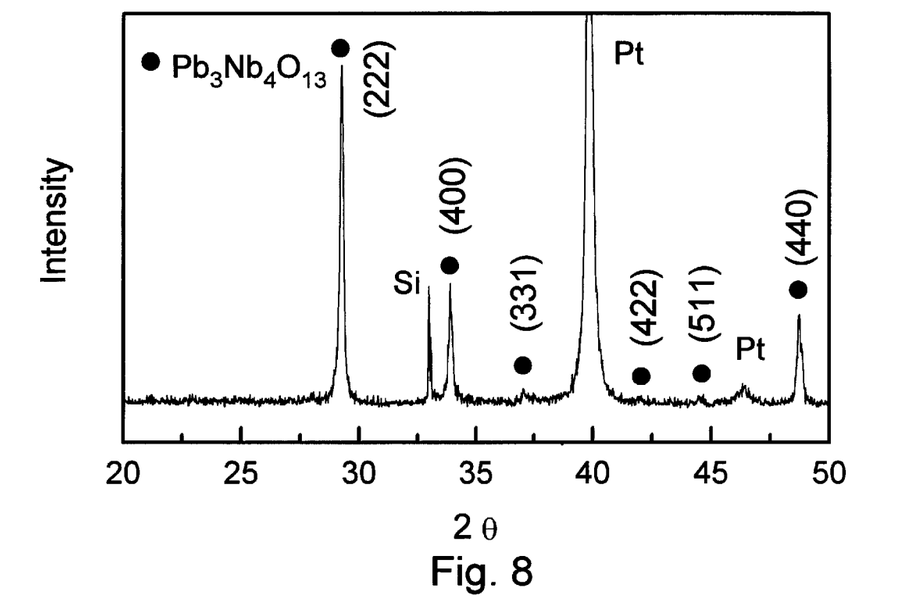
FIG. 8 illustrates the x-ray diffraction of crystallized $Pb_3Nb_4O_{13}$ films prepared by a high-pressure treatment of 77.6 atm at 300° C. for 2 hours according to the invention.

Precursors of $Pb_3Nb_4O_{13}$ films were prepared by mixing lead 2-ethyhexanoate and niobium ethoxide according to the stoichiometric proportion. The prepared precursor was deposited onto $Pt/Ti/SiO_2/Si$ substrates using spin-coating method. The coating and pyrolyzing processes were the same as described above. The pyrolyzed amorphous ceramic films were subjected to a high-pressure treatment. The heating condition was 300° C. under 1140 psi (77.6 atm), and the heating time was 2 hours. After the above treatment, well crystallized $Pb_3Nb_4O_{13}$ films were obtained, as shown in FIG. 8. In this figure, the diffraction peaks with (222), (400), (331), (422), (511), and (440) indexes belonging to $Pb_3Nb_4O_{13}$ are clearly identified. This example confirms the effectiveness of applying the high-pressure process to induce the crystallization of $Pb_3Nb_4O_{13}$ films at low temperatures.

COMPARATIVE EXAMPLE 7

Figure 9:
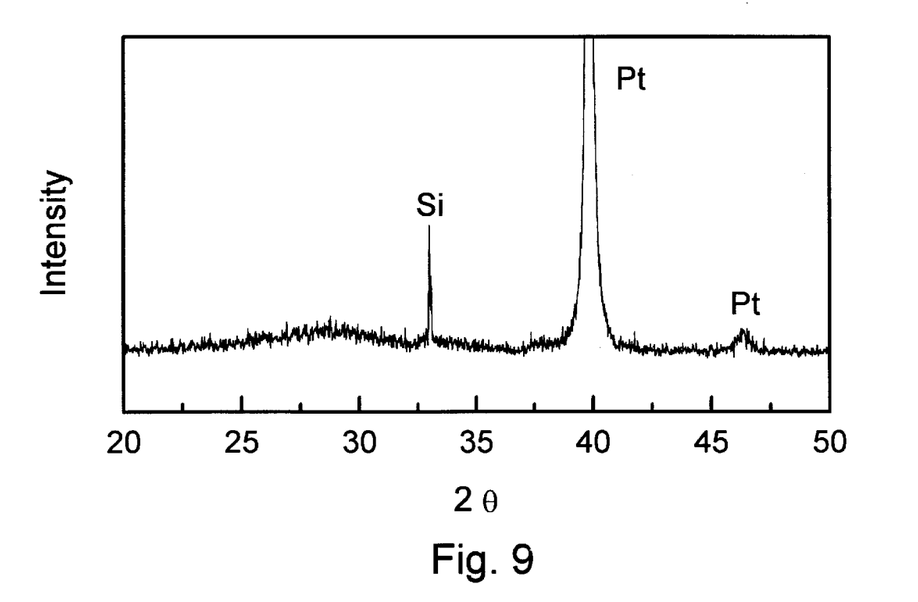
FIG. 9 illustrates the x-ray diffraction of amorphous $Pb_3Nb_4O_{13}$ films heated at 300° C. for 2 hours in a conventional heating process.

The same procedure as in Example 7 was repeated except that the pyrolyzed films were heated in a conventional electric furnace, instead of a high-pressure chamber, at 300° C. for 2 hours. It was found that no crystallization of $Pb_3Nb_4O_{13}$ films occurred after 300° C.-heating. The XRD pattern for the 300° C.-annnealed films is illustrated in FIG. 9. This figure reveals that the annealed films remain amorphous. In comparison with Example 7, the results definitely reveal that the high-pressure process remarkably reduces the crystallization temperature of $Pb_3Nb_4O_{13}$ films.

EXAMPLE 8

This example shows the effects of high-pressure treatment on the crystallization of paraelectric $Pb_3Nb_4O_{13}$ films prepared by the dipping process. Precursors of $Pb_3Nb_4O_{13}$ films were prepared according to the procedure described in Example 7. The prepared precursors were deposited onto $Pt/Ti/SiO_2/Si$ substrates using the dipping method at a rate of 0.3 cm/sec. The coating and pyrolyzing processes were the same as in Example 7, and only amorphous ceramic films were obtained. These amorphous ceramic films were subjected to a high-pressure treatment under 1140 psi (77.6 atm) at 300° C. for 2 hours. After the above treatment, well-crystallized $Pb_3Nb_4O_{13}$ films were obtained. This example confirms that the high pressure treatment can enhance the crystallization of $Pb_3Nb_4O_{13}$ films no matter they are prepared by what types of chemical processing such as spin-coating in Example 7 or dip-coating in Example 8.

What is claimed is:

1. A method for producing a crystallized ceramic film comprising the steps of:

(a) forming an amorphous or partially crystallized ceramic film on a substrate; and (b) crystallizing said amorphous or partially crystallized ceramic film at an elevated temperature and under a pressure, said temperature being below about 550° C., said pressure being larger than 10 atmospheres and lesser than about 250 atmospheres, said method being conducted within a chamber provided with a species that remains volatilized at said temperature and pressure, whereby said pressure is provided by a pressure of vapor of said species.

2. The method of claim 1, wherein said amorphous or partially crystallized ceramic film is crystallized within a closed chamber.

3. The method of claim 1, wherein said species is selected from the group consisting of oxygen, nitrogen, argon, hydrogen, water vapor, carbon dioxide, organic solvent and inorganic solvent or mixtures thereof.

4. The method of claim 3, wherein said species is selected from the group consisting of oxygen, nitrogen, argon, hydrogen, carbon dioxide and water vapor.

5. The method of claim 1, wherein said amorphous or partially crystallized ceramic film is formed by chemical vapor deposition, spin coating, dipping, evaporation, electroplating, electrophoretic deposition, ion-beam deposition, sputtering, or laser ablation.

6. The method of claim 1, wherein said elevated temperature is below 500° C.

7. The method of claim 1, wherein said elevated temperature is between 100° C. and 400° C.

8. The method of claim 1, wherein the crystallized ceramic film is a ferroelectric ceramic film.

9. The method of claim 8, wherein said crystallized ceramic film is selected from the group consisting of $SrBi_2Ta_2O_9$, $BaBi_2Ta_2O_9$, $(Sr_xBa_{1-x})Bi_2Ta_2O_9$, $PbTiO_3$, and $Pb(Zr_xTi_{1-x})O_3$ wherein x is from 0 to 1.

10. The method of claim 9, wherein said crystallized ceramic film is $SrBi_2Ta_2O_9$ and said species is selected from the group consisting of oxygen, nitrogen, argon, hydrogen, water vapor, carbon dioxide, organic solvent and inorganic solvent or mixtures thereof.

11. The method of claim 9, wherein said crystallized ceramic film is $Pb(Zr_xTi_{1-x})O_3$ wherein x is from 0 to 1 and said species is selected from the group consisting of oxygen, nitrogen, argon, hydrogen, water vapor, carbon dioxide, organic solvent and inorganic solvent or mixtures thereof.

12. The method of claim 9, wherein said crystallized ceramic film is $PbTiO_3$ and said species is selected from the group consisting of oxygen, nitrogen, argon, hydrogen, water vapor, carbon dioxide, organic solvent and inorganic solvent or mixtures thereof.

13. The method of claim 1, wherein said crystallized ceramic film is a paraelectric ceramic film.

14. The method of claim 1, wherein said crystallized ceramic film is $Pb_3Nb_4O_{13}$.

15. The method of claim 1, wherein said crystallized ceramic film has a crystal structure of perovskite, layered-perovskite, pyrochlore, spinel, or fluorite.

16. The method of claim 1, wherein said substrate is selected from the group consisting of silicon, ceramic, metal, and polymer material.

17. The method of claim 1, further comprising the step of re-heat-treating at a second temperature ranging from 100° C. to 600° C.

18. The method of claim 1, wherein said pressure is within a range from between about 20 atmospheres and about 250 atmospheres.

19. The method of claim 1, wherein said pressure is within a range from between about 40 atmospheres and about 250 atmospheres.

* * * * *